United States Patent
Wu et al.

(10) Patent No.: US 7,623,052 B1
(45) Date of Patent: Nov. 24, 2009

(54) STRONG SHORT-PULSE INTERFERENCE DETECTION METHOD

(75) Inventors: Songping Wu, Sunnyvale, CA (US); Yui Lin, Santa Clara, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 664 days.

(21) Appl. No.: 11/501,341

(22) Filed: Aug. 9, 2006

Related U.S. Application Data

(60) Provisional application No. 60/761,132, filed on Jan. 23, 2006.

(51) Int. Cl.
*H03M 1/62* (2006.01)

(52) U.S. Cl. .................................. 341/139; 455/245.1

(58) Field of Classification Search ............... 341/139, 341/118, 143, 155, 132; 375/345, 34, 346; 455/67.13, 245.1

See application file for complete search history.

(56) References Cited

U.S. PATENT DOCUMENTS

| | | | | |
|---|---|---|---|---|
| 5,930,310 | A * | 7/1999 | Freeman | 375/346 |
| 6,240,283 | B1 * | 5/2001 | Holcombe | 455/245.1 |
| 6,819,706 | B1 * | 11/2004 | Lim | 375/130 |
| 6,864,817 | B1 * | 3/2005 | Salvi et al. | 341/139 |
| 7,388,529 | B1 * | 6/2008 | Wu et al. | 341/139 |

* cited by examiner

*Primary Examiner*—Peguy JeanPierre

(57) ABSTRACT

A system for detecting interference includes an automatic gain control (AGC) module, a peak detection module, and a control module. The AGC module selectively generates a gain-locked signal when an input signal is received. The peak detector module communicates with the AGC module and selectively generates a peak-detect signal. The control module communicates with the AGC module and the peak detector module and generates a control signal when the control module does not receive the gain-locked signal within a predetermined time after receiving the peak-detect signal.

38 Claims, 12 Drawing Sheets

STRONG SHORT-PULSE INTERFERENCE DETECTION METHOD

CROSS-REFERENCE TO RELATED APPLICATIONS

This application claims the benefit of U.S. Provisional Application No. 60/761,132, filed on Jan. 23, 2006. The disclosure of the above application is incorporated herein by reference in its entirety.

FIELD

The present disclosure relates to communication systems, and more particularly to systems and methods for detecting interference in communication systems.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Communication systems typically comprise transmitters that transmit data over a communication medium and receivers that receive data transmitted by transmitters. Often, receivers receive data that may be corrupted due to noise that distorts data during transmission. Additionally, devices surrounding receivers may generate electromagnetic waves that interfere with data received by receivers. Thus, data received by receivers may not represent data transmitted by transmitters. Consequently, receivers may not accurately interpret and process received data resulting in partial or total data loss.

Referring now to FIGS. 1A-1C, a communication system 10 comprises a transmitter 12 that transmits data to a receiver 14 over a transmission medium 16. The transmission medium 16 may be wireline or wireless. The data received by the receiver 14 may be corrupted due to interference 18 encountered during transmission and/or due to interference 19 caused by electromagnetic waves generated by other devices 20 that surround the receiver 14.

Some receivers use conventional interference detection systems that are capable of detecting interference caused by waveforms of a long duration of the type shown in FIG. 1B. The conventional interference detection systems, however, may fail to detect interference caused by strong pulses of short durations of the type shown in FIG. 1C. Radar pulses are a typical example of strong pulses of short durations that may interfere with operation of receivers in wireless communication systems. Interference caused by some strong pulses of short durations may trigger false alarms. That is, receivers may mistake some strong pulses of short durations as data.

Referring now to FIGS. 2A-2B, the receiver 14 typically comprises an antenna 30 that receives an input signal, an automatic gain control (AGC) module 32 having a gain that varies based on strength of the input signal, a mixer module 33 that mixes a signal generated by a local oscillator module 33-1 with the input signal, a filter module 34 that filters an output of the mixer module 33, an analog-to-digital converter (ADC) module 36 that converts an output of the filter module 34 from analog to digital format, and a digital signal processor (DSP) module 38 that processes an output of the ADC module 36.

Additionally, the receiver 14 typically comprises a peak detector module 40 that generates a peak-detect signal when the output of the AGC module 32 crosses a predetermined threshold in response to the input signal. The predetermined threshold is generally based on characteristics such as packet size, packet length, strength of the input signal, etc. The peak detector module 40 may generate the peak-detect signal when the AGC module 32 determines that the input signal strength is greater than a relative signal strength index (RSSI).

The peak-detect signal activates the DSP module 38. The DSP module 38 generates a gain-drop signal that drops the gain of the AGC module 32 as shown in FIG. 2B. The gain of the AGC module 32 remains low for the duration of the input signal. The duration of the input signal depends on characteristics such as packet size, packet length, etc. The gain of the AGC module 32 returns to normal at the end of the input signal.

On the other hand, an interference signal may trigger a false alarm. That is, the interference signal may cause the peak detector module 40 to mistake the interference signal as true data. The peak detector module 40 may generate the peak-detect signal for the interference signal. Subsequently, the DSP module 38 may generate the gain-drop signal that will drop the gain of the AGC module 32. The gain of the AGC module 32, however, may not return to normal since the interference signal may have unknown and/or unknowable characteristics. This can degrade system performance and may cause system malfunction and/or data loss.

SUMMARY

A system for detecting interference comprises an automatic gain control (AGC) module, a peak detector module, and a control module. The AGC module selectively generates a gain-locked signal when an input signal is received. The peak detector module communicates with the AGC module and selectively generates a peak-detect signal. The control module communicates with the AGC module and the peak detector module and generates a control signal when the control module does not receive the gain-locked signal within a predetermined time after receiving the peak-detect signal.

In another feature, the AGC module generates the gain-locked signal when a gain of the AGC module stabilizes after the input signal is received.

In another feature, the peak detector module generates the peak-detect signal when a gain of the AGC module decreases to a value that is less than a predetermined threshold when the input signal is received.

In another feature, the predetermined time is greater than a settling time of the AGC module.

In another feature, a gain of the AGC module stabilizes within a settling time after the input signal is received when the input signal is not an interference signal.

In another feature, the control module determines that the input signal is not an interference signal when the control module receives the gain-locked signal within the predetermined time after receiving the peak-detect signal.

In another feature, the control module determines that the input signal is an interference signal when the control module does not receive the gain-locked signal within the predetermined time after the peak-detect signal is received.

In another feature, the peak detector module generates the peak-detect signal when the strength of the input signal is greater than a relative signal strength index (RSSI).

In another feature, the control signal resets the system.

In another feature, the control signal resets the gain of the AGC module.

In another feature, a receiver comprises the system.

In another feature, a network device comprises the system.

In another feature, an access point comprises the system.

In another feature, a client station comprises the system.

In still other features, a method for detecting interference comprises selectively generating a gain-locked signal when an input signal is received, selectively generating a peak-detect signal, and generating a control signal when the gain-locked signal is not received within a predetermined time after receiving the peak-detect signal.

In another feature, the method further comprises generating the gain-locked signal when a gain of an AGC module stabilizes after the input signal is received.

In another feature, the method further comprises generating the peak-detect signal when a gain of an AGC module decreases to a value that is less than a predetermined threshold when the input signal is received.

In another feature, the method further comprises setting the predetermined time greater than a settling time of an AGC module. A gain of the AGC module stabilizes within the settling time after the input signal is received when the input signal is not an interference signal.

In another feature, the method further comprises determining that the input signal is not an interference signal when the gain-locked signal is received within the predetermined time after receiving the peak-detect signal.

In another feature, the method further comprises determining that the input signal is an interference signal when the gain-locked signal is not received within the predetermined time after the peak-detect signal is received.

In another feature, the method further comprises generating the peak-detect signal when the strength of the input signal is greater than a relative signal strength index (RSSI).

In another feature, the method further comprises resetting a system that receives the input signal using the control signal.

In another feature, the method further comprises resetting a gain of an AGC module using the control signal.

In still other features, a system for detecting interference comprises automatic gain control (AGC) means for selectively generating a gain-locked signal when an input signal is received. The system comprises peak detector means for communicating with the AGC means and for selectively generating a peak-detect signal. The system further comprises control means for communicating with the AGC means and the peak detector means and for generating a control signal when the control means does not receive the gain-locked signal within a predetermined time after receiving the peak-detect signal.

In another feature, the AGC means generates the gain-locked signal when a gain of the AGC means stabilizes after the input signal is received.

In another feature, the peak detector means generates the peak-detect signal when a gain of the AGC means decreases to a value that is less than a predetermined threshold when the input signal is received.

In another feature, the predetermined time is greater than a settling time of the AGC means.

In another feature, a gain of the AGC means stabilizes within a settling time after the input signal is received when the input signal is not an interference signal.

In another feature, the control means determines that the input signal is not an interference signal when the control means receives the gain-locked signal within the predetermined time after receiving the peak-detect signal.

In another feature, the control means determines that the input signal is an interference signal when the control means does not receive the gain-locked signal within the predetermined time after the peak-detect signal is received.

In another feature, the peak detector means generates the peak-detect signal when the strength of the input signal is greater than a relative signal strength index (RSSI).

In another feature, the control signal resets the system.

In another feature, the control signal resets the gain of the AGC means.

In another feature, a receiver comprises the system.

In another feature, a network device comprises the system.

In another feature, an access point comprises the system.

In another feature, a client station comprises the system.

In still other features, a computer program executed by a processor for detecting interference comprises selectively generating a gain-locked signal when an input signal is received, selectively generating a peak-detect signal, and generating a control signal when the gain-locked signal is not received within a predetermined time after receiving the peak-detect signal.

In another feature, the computer program further comprises generating the gain-locked signal when a gain of an AGC module stabilizes after the input signal is received.

In another feature, the computer program further comprises generating the peak-detect signal when a gain of an AGC module decreases to a value that is less than a predetermined threshold when the input signal is received.

In another feature, the computer program further comprises setting the predetermined time greater than a settling time of an AGC module. A gain of the AGC module stabilizes within the settling time after the input signal is received when the input signal is not an interference signal.

In another feature, the computer program further comprises determining that the input signal is not an interference signal when the gain-locked signal is received within the predetermined time after receiving the peak-detect signal.

In another feature, the computer program further comprises determining that the input signal is an interference signal when the gain-locked signal is not received within the predetermined time after the peak-detect signal is received.

In another feature, the computer program further comprises generating the peak-detect signal when the strength of the input signal is greater than a relative signal strength index (RSSI).

In another feature, the computer program further comprises resetting a system that receives the input signal using the control signal.

In another feature, the computer program further comprises resetting a gain of an AGC module using the control signal.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
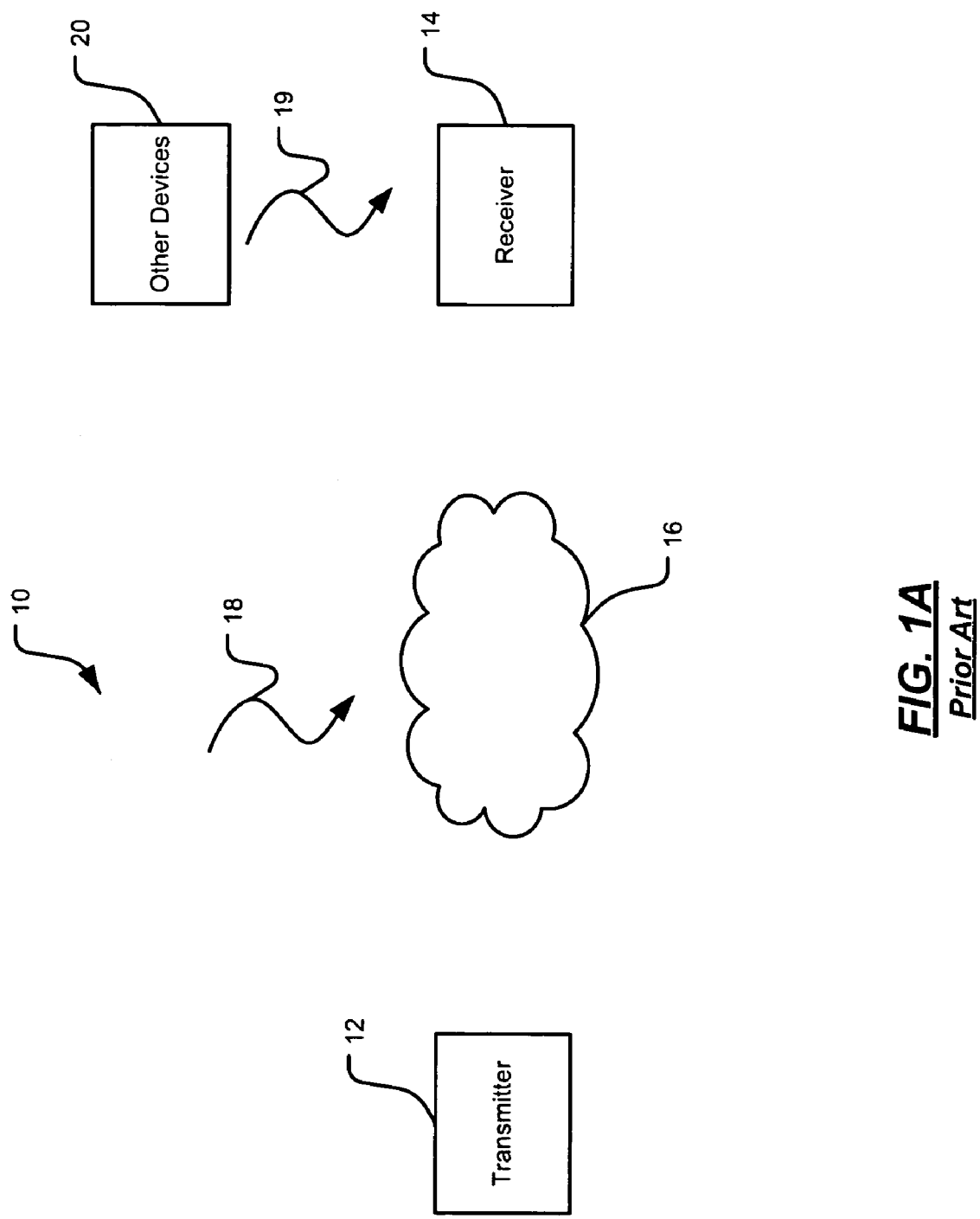
FIG. 1A is a functional block diagram of an exemplary communication system according to the prior art.
Figure 1B:
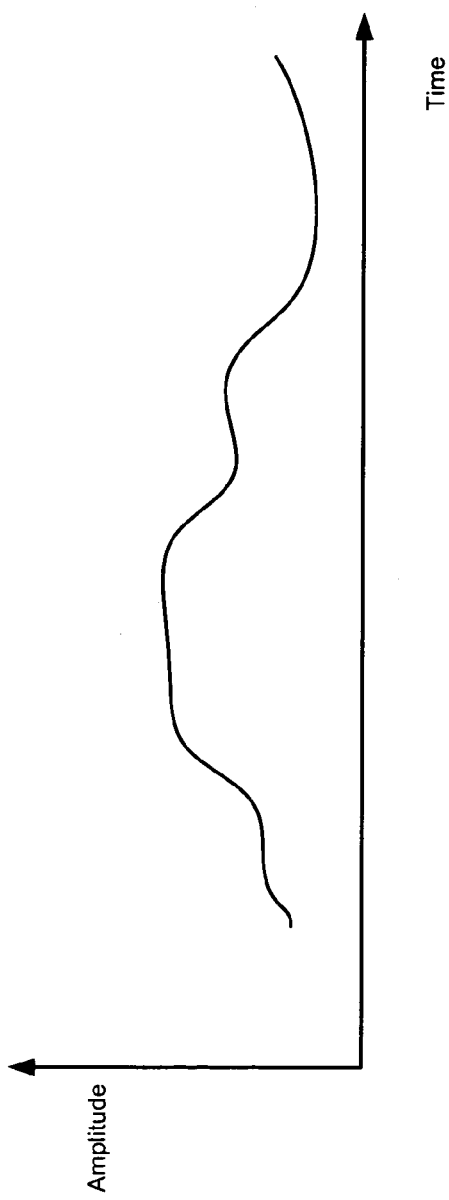
FIG. 1B illustrates an exemplary interference signal in the form of a continuous waveform of long duration.
Figure 1C:
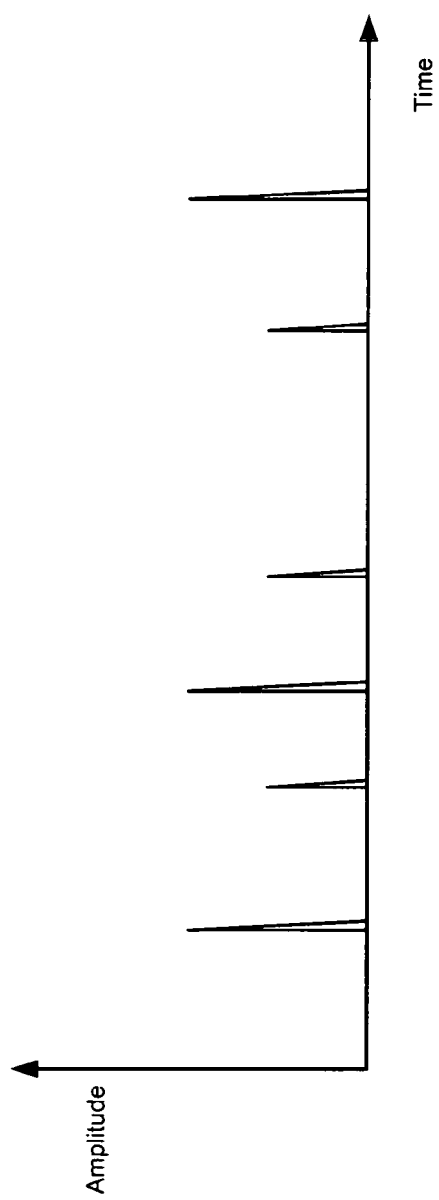
FIG. 1C illustrates exemplary interference in the form of pulses of short duration.
Figure 2A:
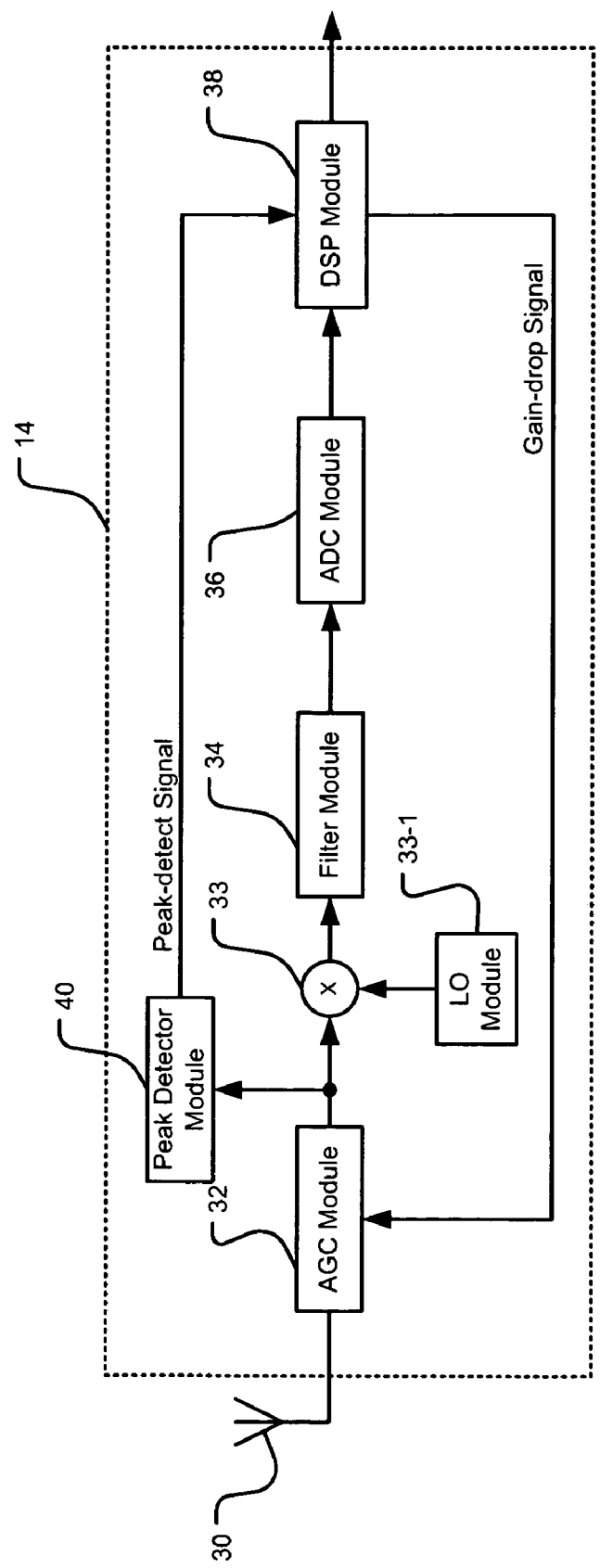
FIG. 2A is a functional block diagram of an exemplary receiver according to the prior art.
Figure 2B:
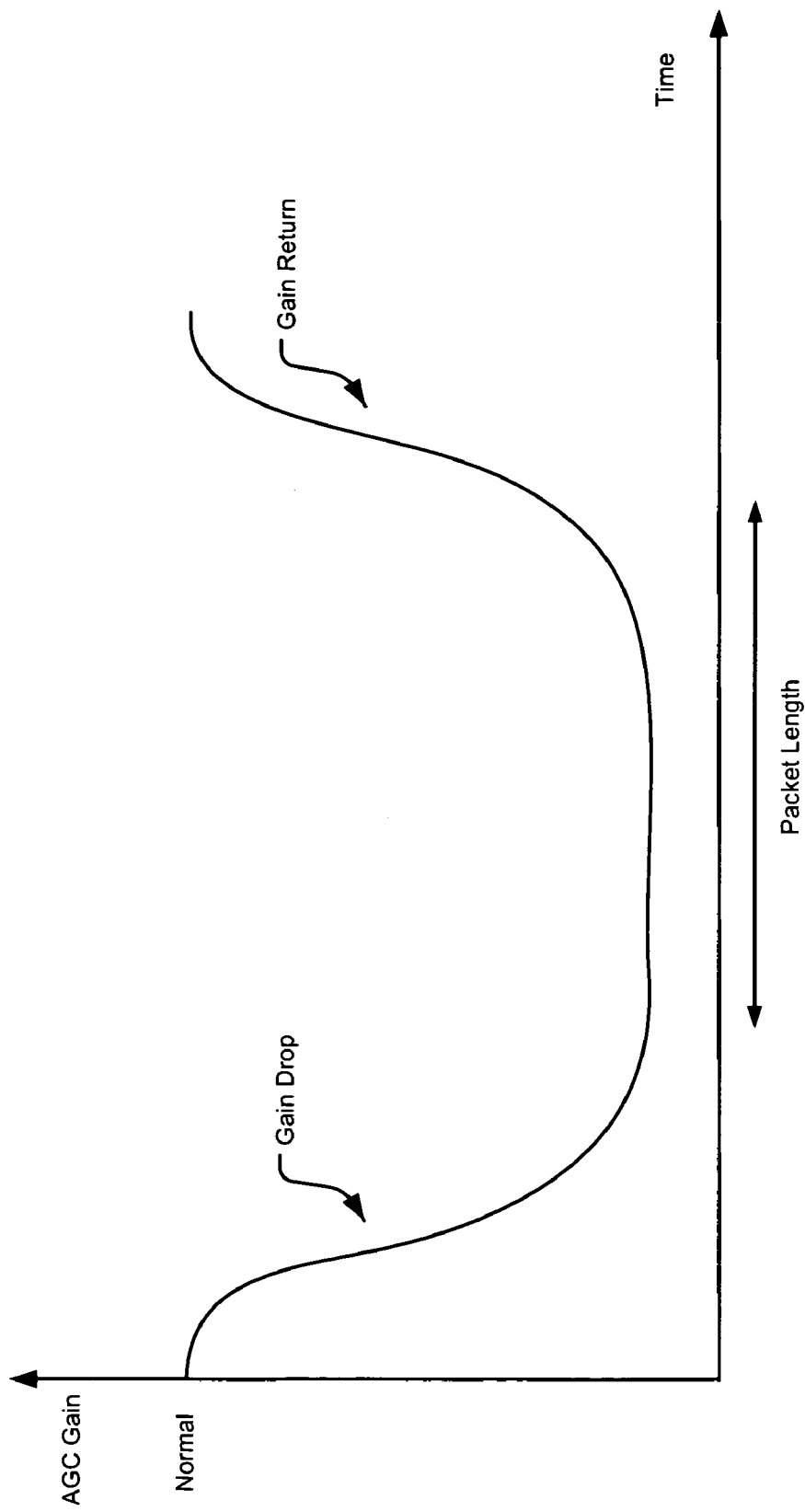
FIG. 2B is an exemplary graph of gain of an automatic gain control (AGC) module relative to time.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
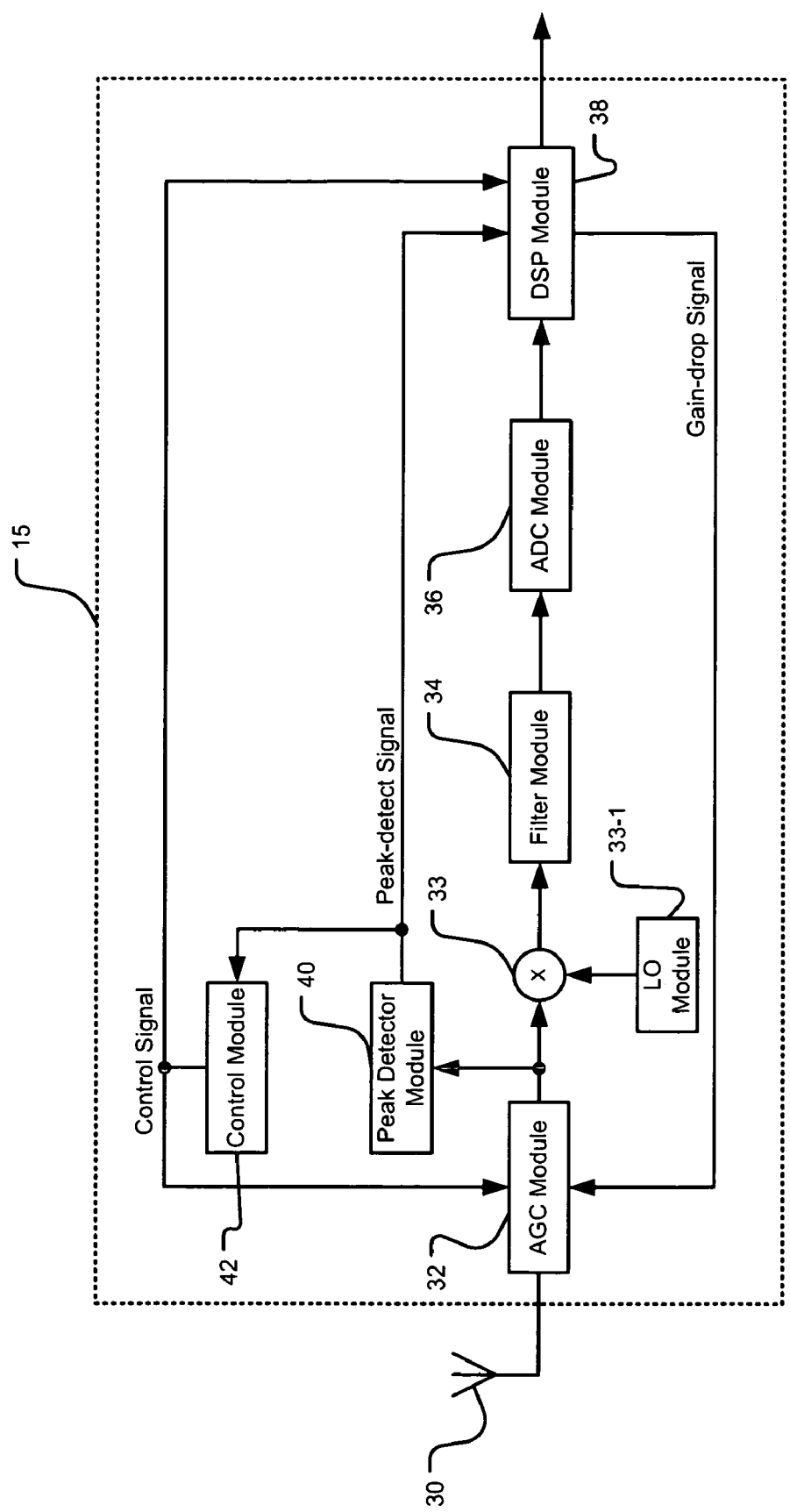
FIG. 3 is a functional block diagram of an exemplary receiver that detects strong short-pulse interference according to the present disclosure.

Referring now to FIG. 3, a receiver module 15 that detects strong short-pulse interference comprises an antenna 30, an automatic gain control (AGC) module 32, a mixer module 33, a local oscillator module 33-1, a filter module 34, an analog-to-digital converter (ADC) module 36, a digital signal processor (DSP) module 38, a peak detector module 40, and a control module 42. The antenna 30 receives input signals.

The AGC module 32 has a gain that varies based on the strength of an input signal. The mixer module 33 mixes a signal generated by the local oscillator module 33-1 with the input signal. The filter module 34 filters an output of the mixer module 33. The ADC module 36 converts an output of the filter module 34 from analog to digital format. The DSP module 38 processes an output of the ADC module 36.

The peak detector module 40 generates a peak-detect signal when the output of the AGC module 32 crosses a predetermined threshold in response to the input signal. The predetermined threshold is generally based on characteristics such as packet size, packet length, strength of the input signal, etc. Additionally, the peak detector module 40 may generate the peak-detect signal when the AGC module 32 determines that the strength of the input signal is greater than a relative signal strength index (RSSI). The control module 42 sets a peak-detect flag when the control module 42 receives the peak-detect signal.

The peak-detect signal activates the DSP module 38. The DSP module 38 generates a gain-drop signal that decreases the gain of the AGC module 32 from a normal value to a lower value that is lower than the normal value. The gain of the AGC module 32 remains at the lower value for the duration of the input signal. The duration of the input signal depends on characteristics such as packet size, packet length, etc. The gain of the AGC module 32 returns to the normal value at the end of the input signal.

The control module 42 detects interference caused by strong pulses of short durations and distinguishes interference from true data (e.g., a packet). Normally, when the input signal is true data, the gain of the AGC module 32 stops varying in response to the input signal and settles down (i.e., locks or stabilizes) to a value different from the normal value within a predetermined time. The predetermined time is called a settling time $t_{settle}$, which is generally a known design parameter.

On the other hand, when the input signal is an interference signal instead of true data, the gain of the AGC module 32 may not stabilize within $t_{settle}$. That is, when the input signal is an interference signal, the gain of the AGC module 32 may stabilize after $t_{settle}$.

The AGC module 32 generates a gain-locked signal when the gain of the AGC module 32 locks or stabilizes. Thus, the AGC module 32 may generate the gain-locked signal within $t_{settle}$ when the input signal is true data or after $t_{settle}$ when the input signal is an interference signal instead of true data. The control module 42 sets a gain-locked flag when the control module 42 receives the gain-locked signal.

When the control module 42 determines that the peak-detect flag is set but the gain-locked flag is not set, the control module 42 begins interference detection. The control module 42 activates a counter that counts a predetermined time T. The time T is set to a value that is greater than $t_{settle}$. At the end of time T, the control module 42 checks whether the gain-locked flag is set. If the gain-locked flag is set, the control module 42 concludes that the input signal is true data instead of interference. Otherwise, the control module 42 concludes that the input signal is an interference signal, and generates a control signal that resets the receiver 15.

During normal operation, that is, when the receiver module 15 receives true data, the gain of the AGC module 32 returns to the normal value at the end of the input signal. Additionally, when the receiver module 15 receives true data, the gain-locked flag is set within $t_{settle}$, that is, before time T expires. Thus, when the control module 42 checks the gain-locked flag after time T, the control module 42 may find that the gain-locked flag is already set at the end of time T during normal operation. In that case, the control module 42 determines that the input signal is true data and not interference.

On the other hand, when the receiver module 15 receives interference in the form of strong pulses of short duration, the gain of the AGC module 32 may not lock or stabilize within $t_{settle}$. Consequently, the control module 42 may find that the gain-locked flag is not set at the end of time T. In that case, the control module 42 concludes that the input signal is interference instead of true data.

When the control module 42 determines that the input signal is interference, the control module 42 generates the control signal that resets the receiver module 15. Specifically, the control signal may reset the DSP module 38 and/or the gain of the AGC module 32 to the normal value. The AGC module 32 is now ready to respond to subsequent input signals the receiver module 15 may receive.

Thus, the control module 42 prevents a malfunction of the receiver module 15 that may be caused by the interference. Additionally, the control module 42 prevents subsequent data loss by resetting the gain of the AGC module 32 when the input signal is interference instead of data.

The time T can be set according to $t_{settle}$ if $t_{settle}$ has a fixed value. If $t_{settle}$ varies within a range, T may be set equal to the upper limit of $t_{settle}$. Additionally, T can be set equal to $t_{settle}$ plus an offset or the upper limit of $t_{settle}$ plus an offset to make T suitable for specific applications. In other words, T can be tailored to ensure that data will not be lost while eliminating interference.

Figure 4:
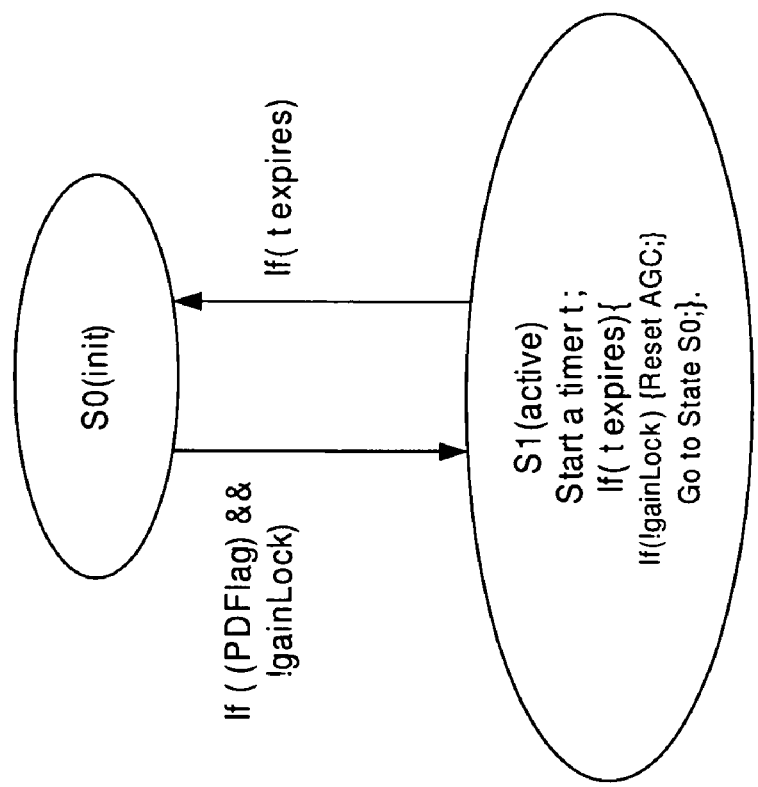
FIG. 4 is a state diagram of a state machine that detects strong short-pulse interference according to the present disclosure.

Referring now to FIG. 4, a state machine 50 that detects strong short-pulse interference comprises two states: an initial or inactive state S0 and a monitoring or active state S1. The state machine 50 is in the initial state S0 until the control module 42 sets the peak-detect flag. When the control module 42 finds that the peak-detect flag is set and the gain-locked flag is not set, the state machine 50 transitions from state S0 to state S1.

In state S1, the control module 42 starts a counter that counts time T, which is greater than $t_{settle}$ of the AGC module 32. At the end of the time T, the control module 42 checks whether the gain-locked flag is set. If the control module 42 finds that the gain-locked flag is set, the control module 42 concludes that the input signal is not an interference signal. In that case, the control module 42 does not reset the receiver module 15, and the state machine 50 transitions from state S1 to S0.

If, however, the control module 42 finds that the gain-locked flag is not set at the end of time T, the control module 42 concludes that the input signal is interference. In that case, the control module 42 generates a control signal that resets the receiver module 15 (i.e., the DSP module 38 and/or the gain of the AGC module 32), and the state machine 50 transitions from state S1 to S0.

Figure 5:
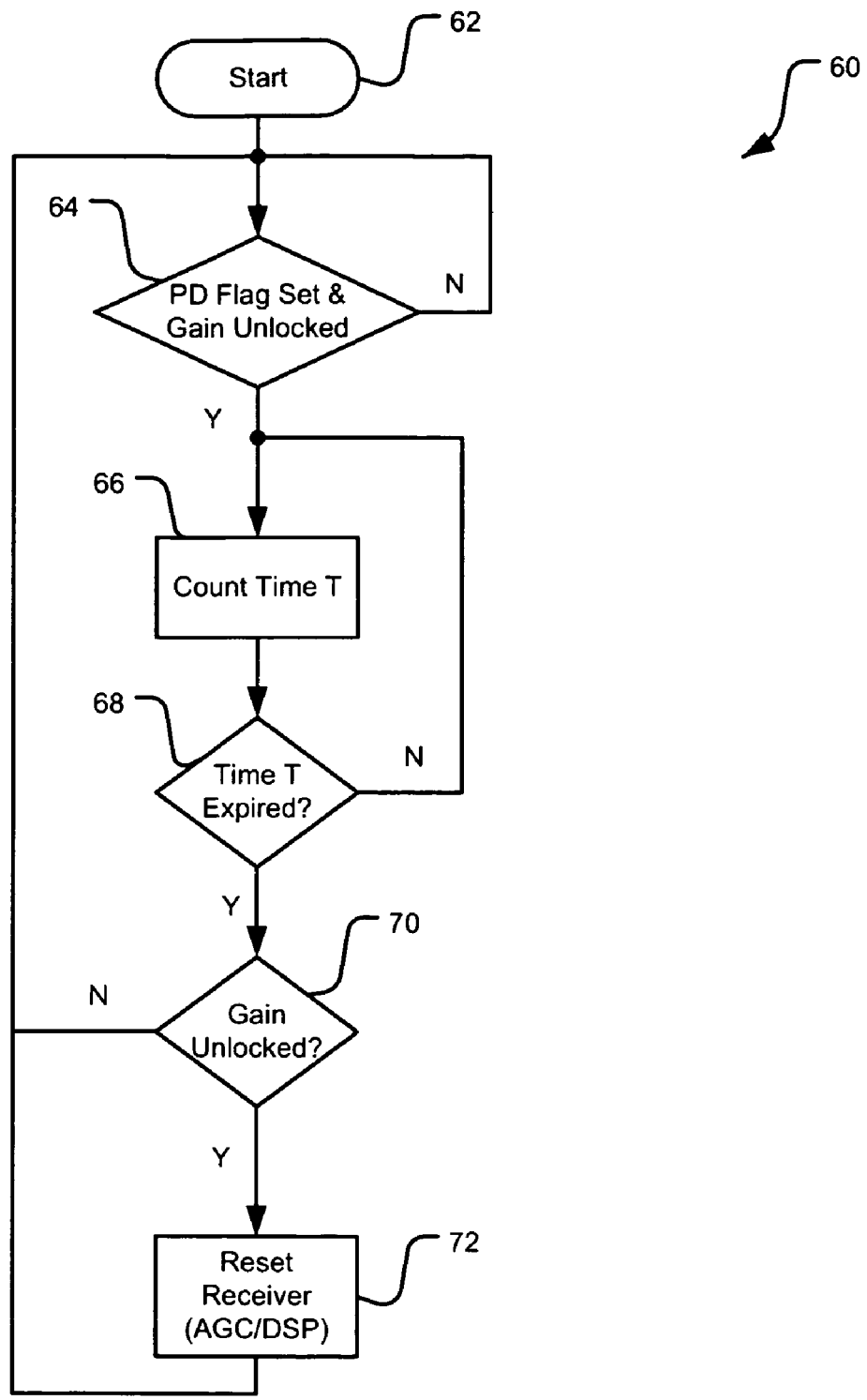
FIG. 5 is a flowchart of a method for detecting strong short-pulse interference according to the present disclosure.

Referring now to FIG. 5, a method 60 for detecting strong short-pulse interference begins at step 62. The control module 42 checks in step 64 whether the peak-detect flag is set and the gain-locked flag is not set. If false, the method 60 returns to step 62. If true, the control module 42 starts a counter in step 66 that counts time T, where time T is greater than $t_{settle}$ of the AGC module 32. The control module 42 checks in step 68 whether the counter has finished counting time T. If false, the counter continues to count in step 66. If true, the control module 42 checks in step 70 if the gain-locked flag is set. If true, that is, if the gain of the AGC module 32 is locked, the method returns to step 62. If false, that is, if the gain is still unlocked, the control module 42 generates a control signal that resets the receiver module 15 (i.e., the DSP module 38 and/or the gain of the AGC module 32) in step 72, and the method 60 returns to step 62.

Figure 6A:
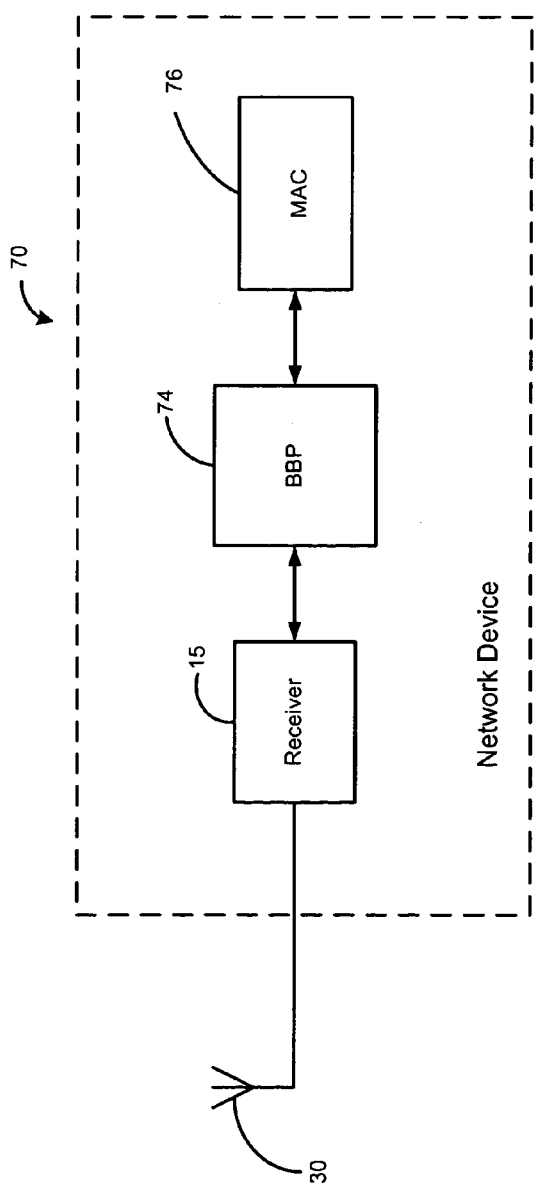
FIG. 6A is a functional block diagram of an exemplary implementation of the receiver of FIG. 3 in a wireless network device.
Figure 6B:
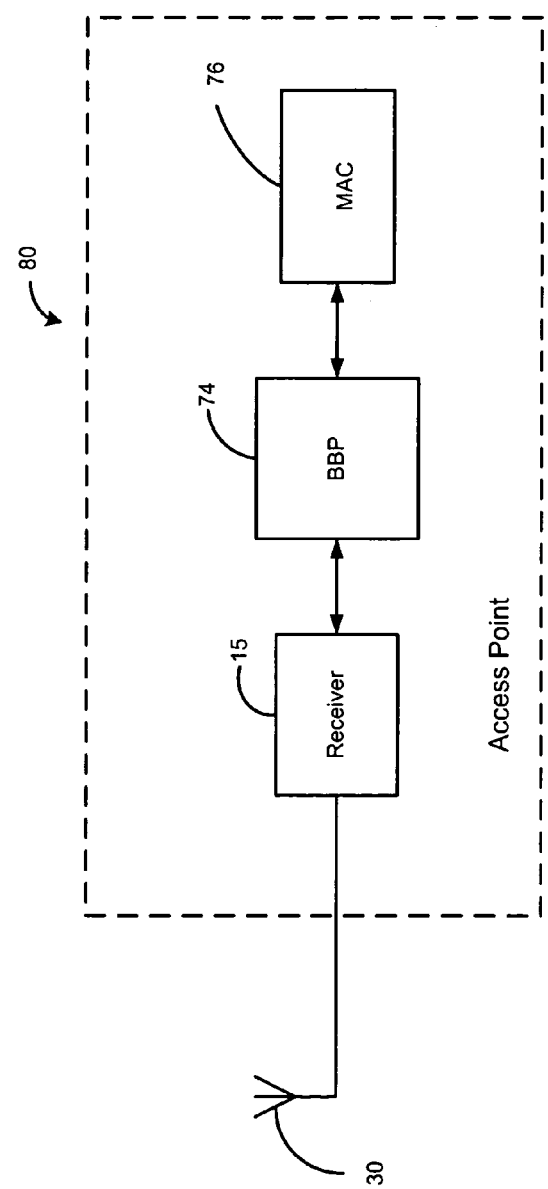
FIG. 6B is a functional block diagram of an exemplary implementation of the receiver of FIG. 3 in an access point.
Figure 6C:
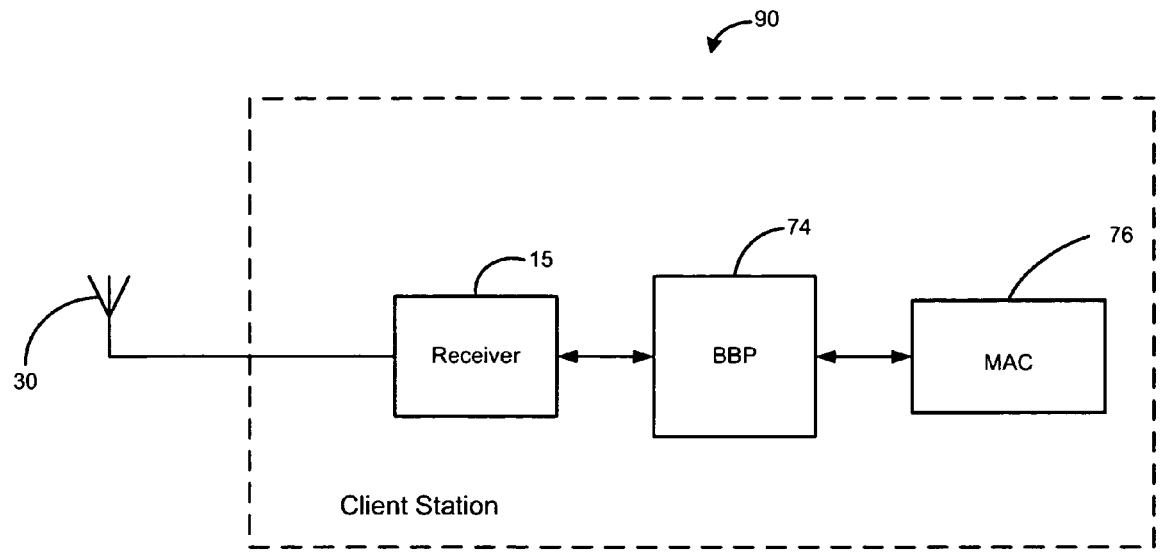
FIG. 6C is a functional block diagram of an exemplary implementation of the receiver of FIG. 3 in a client station.

Referring now to FIGS. 6A-6E, various exemplary implementations of the receiver module 15 are shown. FIG. 6A shows an exemplary implementation of the receiver module 15 in a wireless network device 70. In some implementations, some modules of the receiver module 15 may be implemented in a baseband processor (BBP) 74 while some other modules of the receiver module 15 may be implemented in a medium access controller (MAC) 76 of the wireless network device 70. FIGS. 6B-6C show exemplary implementations of the receiver module 15 in a wireless access point 80 and a wireless client station 90, respectively.

Figure 6D:
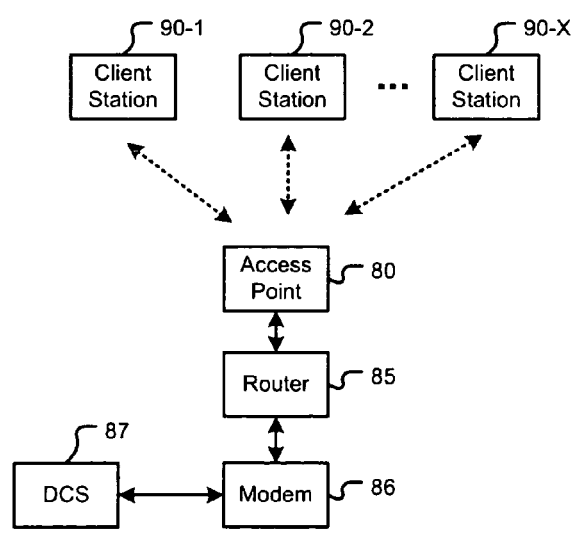
FIG. 6D is a functional block diagram of an exemplary wireless network operating in an infrastructure mode.
Figure 6E:
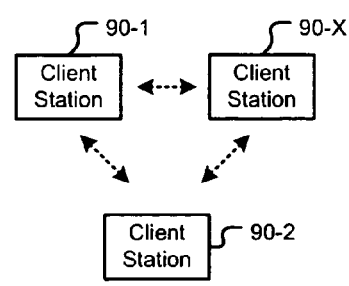
FIG. 6E is a functional block diagram of an exemplary wireless network operating in an ad-hoc mode.

In FIG. 6D, an infrastructure network is shown with wireless client stations 90-1, 90-2, ..., and 90-X that communicate with an access point 80. The access point 80 may communicate with a router 85. A modem 86 may provide access to a distributed communications system (DCS) 87 such as the Internet, a wide area network (WAN), and/or a local area network (LAN). In FIG. 6E, the client stations 90-1, 90-2, ..., and 90-X are configured in an ad hoc mode.

Figure 7B:
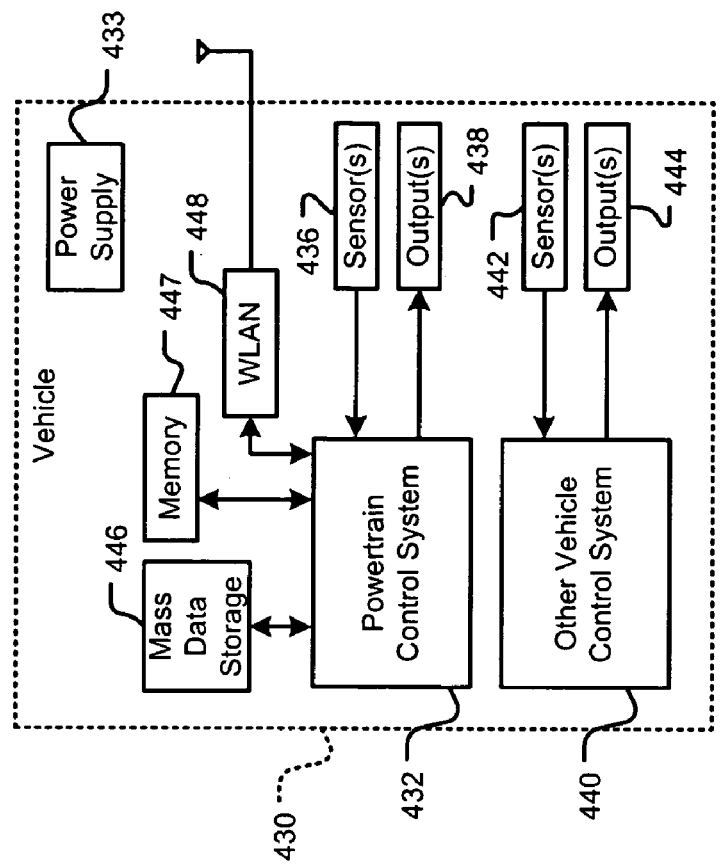
FIG. 7B is a functional block diagram of a vehicle control system.
Figure 7A:
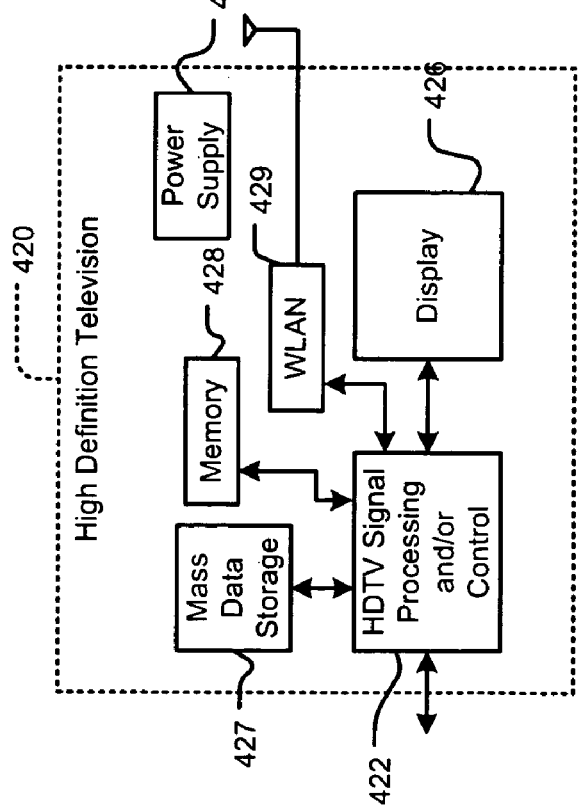
FIG. 7A is a functional block diagram of a high definition television.

Referring now to FIGS. 7A-7E, various exemplary implementations of the present invention are shown. Referring now to FIG. 7A, the present invention can be implemented in a high definition television (HDTV) 420. The present invention may be implemented in either or both signal processing and/or control circuits, which are generally identified in FIG. 7A at 422, and mass data storage 427 of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 7B, the present invention may be implemented in a control system of a vehicle 430 and mass data storage 446 of the vehicle control system 430. In some implementations, the present invention may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 7C:
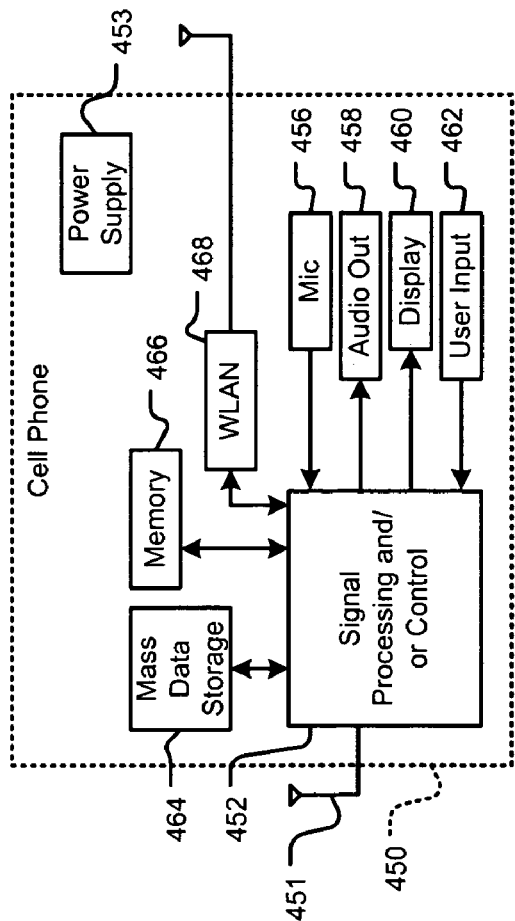
FIG. 7C is a functional block diagram of a cellular phone.

Referring now to FIG. 7C, the present invention can be implemented in a cellular phone 450 that may include a cellular antenna 451. The present invention may be implemented in either or both signal processing and/or control circuits, which are generally identified in FIG. 7C at 452, and mass data storage 464 of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 7D:
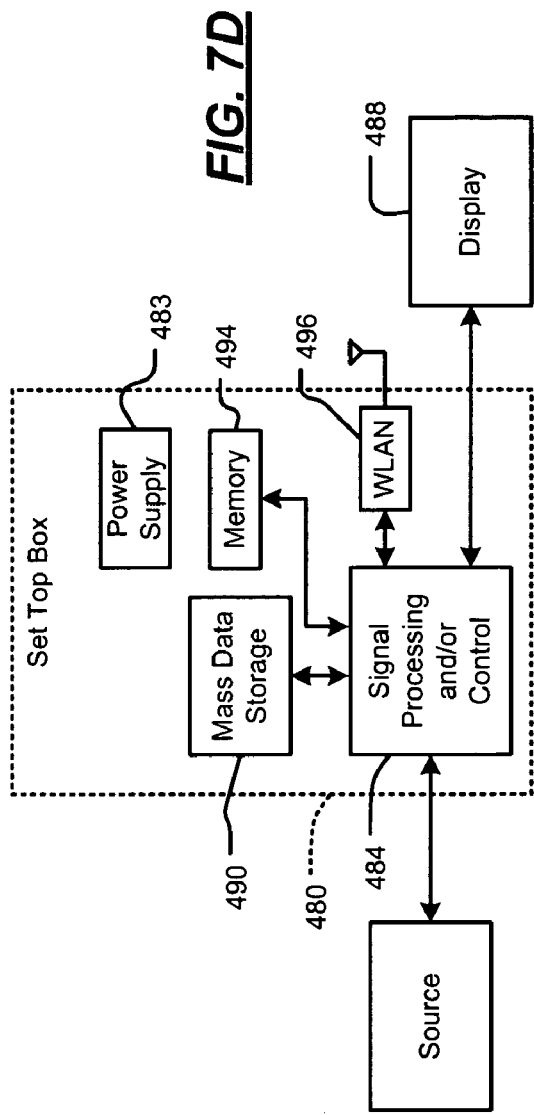
FIG. 7D is a functional block diagram of a set top box.

Referring now to FIG. 7D, the present invention can be implemented in a set top box 480. The present invention may be implemented in either or both signal processing and/or control circuits, which are generally identified in FIG. 7D at 484, and mass data storage 490 of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 7E:
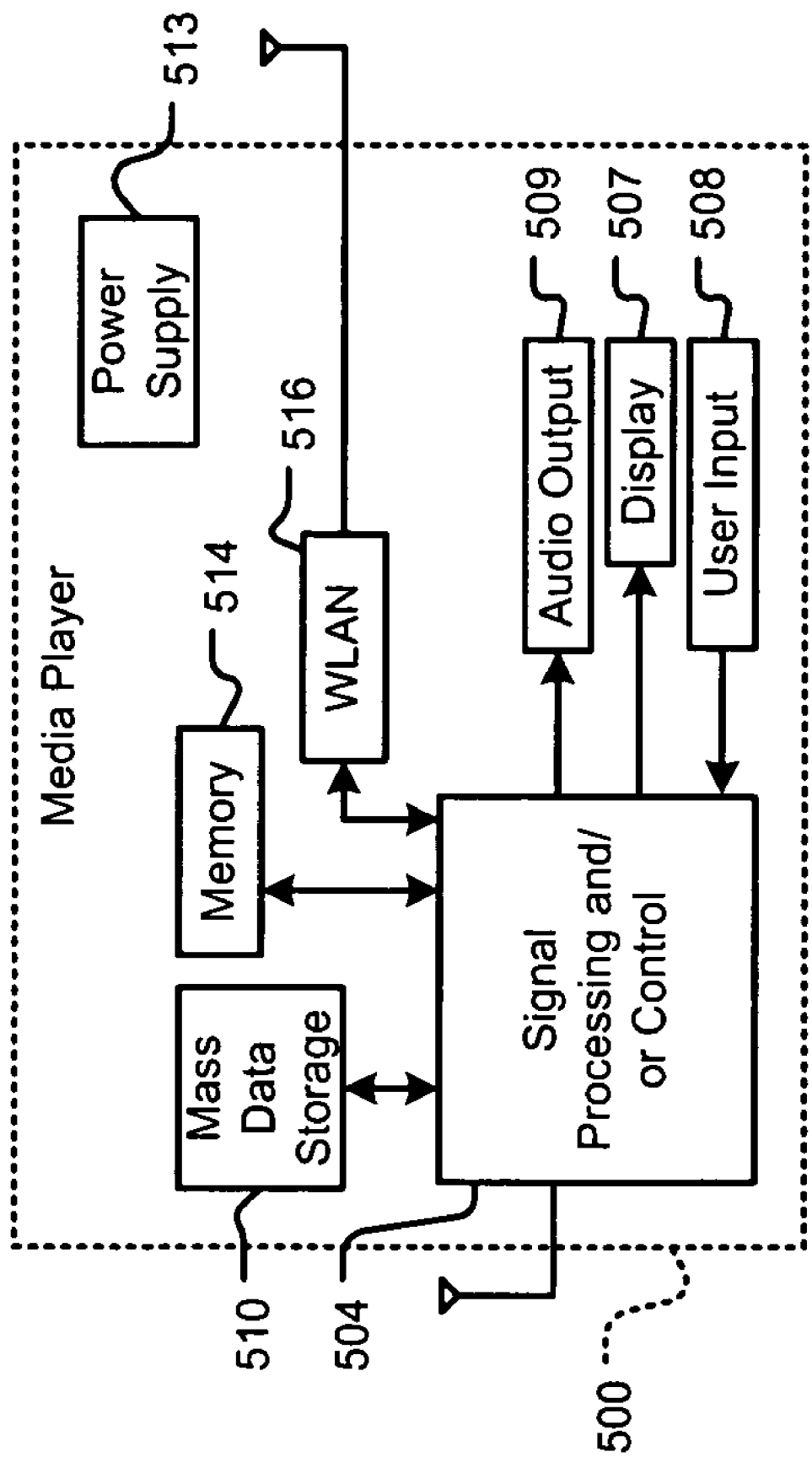
FIG. 7E is a functional block diagram of a media player.

Referring now to FIG. 7E, the present invention can be implemented in a media player 500. The present invention may be implemented in either or both signal processing and/or control circuits, which are generally identified in FIG. 7E at 504, and mass data storage 510 of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system for detecting interference, comprising:
    an automatic gain control (AGC) module that selectively generates a gain-locked signal when an input signal is received;
    a peak detector module that communicates with said AGC module and that selectively generates a peak-detect signal; and
    a control module that communicates with said AGC module and said peak detector module and that generates a control signal when said control module does not receive said gain-locked signal within a predetermined time after receiving said peak-detect signal.

2. The system of claim 1 wherein said AGC module generates said gain-locked signal when a gain of said AGC module stabilizes after said input signal is received.

3. The system of claim 1 wherein said peak detector module generates said peak-detect signal when a gain of said AGC module decreases to a value that is less than a predetermined threshold when said input signal is received.

4. The system of claim 1 wherein said predetermined time is greater than a settling time of said AGC module.

5. The system of claim 1 wherein a gain of said AGC module stabilizes within a settling time after said input signal is received when said input signal is not an interference signal.

6. The system of claim 1 wherein said control module determines that said input signal is not an interference signal when said control module receives said gain-locked signal within said predetermined time after receiving said peak-detect signal.

7. The system of claim 1 wherein said control module determines that said input signal is an interference signal when said control module does not receive said gain-locked signal within said predetermined time after said peak-detect signal is received.

8. The system of claim 1 wherein said peak detector module generates said peak-detect signal when the strength of said input signal is greater than a relative signal strength index (RSSI).

9. The system of claim 1 wherein said control signal resets said system.

10. The system of claim 1 wherein said control signal resets said gain of said AGC module.

11. A receiver comprising the system of claim 1.

12. A network device comprising the system of claim 1.

13. An access point comprising the system of claim 1.

14. A client station comprising the system of claim 1.

15. The system of claim 1 wherein said control signal resets said gain of said AGC means.

16. A method for detecting interference, comprising:
selectively generating a gain-locked signal when an input signal is received;
selectively generating a peak-detect signal; and
generating a control signal when said gain-locked signal is not received within a predetermined time after receiving said peak-detect signal.

17. The method of claim 16 further comprising generating said gain-locked signal when a gain of an AGC module stabilizes after said input signal is received.

18. The method of claim 16 further comprising generating said peak-detect signal when a gain of an AGC module decreases to a value that is less than a predetermined threshold when said input signal is received.

19. The method of claim 16 further comprising setting said predetermined time greater than a settling time of an AGC module.

20. The method of claim 19 wherein a gain of said AGC module stabilizes within said settling time after said input signal is received when said input signal is not an interference signal.

21. The method of claim 16 further comprising determining that said input signal is not an interference signal when said gain-locked signal is received within said predetermined time after receiving said peak-detect signal.

22. The method of claim 16 further comprising determining that said input signal is an interference signal when said gain-locked signal is not received within said predetermined time after said peak-detect signal is received.

23. The method of claim 16 further comprising generating said peak-detect signal when the strength of said input signal is greater than a relative signal strength index (RSSI).

24. The method of claim 16 further comprising resetting a system that receives said input signal using said control signal.

25. The method of claim 16 further comprising resetting a gain of an AGC module using said control signal.

26. A system for detecting interference, comprising:
automatic gain control (AGC) means for selectively generating a gain-locked signal when an input signal is received;
peak detector means for communicating with said AGC means and for selectively generating a peak-detect signal; and
control means for communicating with said AGC means and said peak detector means and for generating a control signal when said control means does not receive said gain-locked signal within a predetermined time after receiving said peak-detect signal.

27. The system of claim 26 wherein said AGC means generates said gain-locked signal when a gain of said AGC means stabilizes after said input signal is received.

28. The system of claim 26 wherein said peak detector means generates said peak-detect signal when a gain of said AGC means decreases to a value that is less than a predetermined threshold when said input signal is received.

29. The system of claim 26 wherein said predetermined time is greater than a settling time of said AGC means.

30. The system of claim 26 wherein a gain of said AGC means stabilizes within a settling time after said input signal is received when said input signal is not an interference signal.

31. The system of claim 26 wherein said control means determines that said input signal is not an interference signal when said control means receives said gain-locked signal within said predetermined time after receiving said peak-detect signal.

32. The system of claim 26 wherein said control means determines that said input signal is an interference signal when said control means does not receive said gain-locked signal within said predetermined time after said peak-detect signal is received.

33. The system of claim 26 wherein said peak detector means generates said peak-detect signal when the strength of said input signal is greater than a relative signal strength index (RSSI).

34. The system of claim 26 wherein said control signal resets said system.

35. A receiver comprising the system of claim 26.

36. A network device comprising the system of claim 26.

37. An access point comprising the system of claim 26.

38. A client station comprising the system of claim 26.

* * * * *